(12) United States Patent
Liu et al.

(10) Patent No.: US 7,553,706 B2
(45) Date of Patent: Jun. 30, 2009

(54) TFT FABRICATION PROCESS

(75) Inventors: Ping Liu, Mississauga (CA); Yiliang Wu, Mississauga (CA); Beng S Ong, Mississauga (CA)

(73) Assignee: Xerox Corporation, Norwalk, CT (US)

(*) Notice: Subject to any disclaimer, the term of this patent is extended or adjusted under 35 U.S.C. 154(b) by 0 days.

(21) Appl. No.: 11/276,634

(22) Filed: Mar. 8, 2006

(65) Prior Publication Data
US 2006/0234430 A1    Oct. 19, 2006

Related U.S. Application Data

(62) Division of application No. 11/104,728, filed on Apr. 13, 2005.

(51) Int. Cl.
*H01L 21/00* (2006.01)
(52) U.S. Cl. .............................. 438/149; 257/E51.007
(58) Field of Classification Search .................... 257/40, 257/406, 410, 411; 438/99, 287
See application file for complete search history.

(56) References Cited

U.S. PATENT DOCUMENTS

| | | | | |
|---|---|---|---|---|
| 5,549,934 A * | 8/1996 | Garza et al. | ................. | 427/489 |
| 5,705,826 A * | 1/1998 | Aratani et al. | ................. | 257/40 |
| 6,222,225 B1 * | 4/2001 | Nakamura et al. | .......... | 257/315 |
| 6,300,988 B1 * | 10/2001 | Ishihara et al. | ................. | 349/43 |
| 6,319,794 B1 * | 11/2001 | Akatsu et al. | ................ | 438/424 |
| 6,323,106 B1 * | 11/2001 | Huang et al. | ................. | 438/433 |
| 6,433,359 B1 | 8/2002 | Kelley et al. | | |
| 6,448,606 B1 * | 9/2002 | Yu et al. | ...................... | 257/315 |
| 6,461,936 B1 * | 10/2002 | von Ehrenwall | ............ | 438/424 |
| 6,576,199 B1 * | 6/2003 | Liu et al. | .................... | 422/177 |
| 6,621,099 B2 * | 9/2003 | Ong et al. | ..................... | 257/40 |
| 6,649,472 B1 * | 11/2003 | Hsieh | ......................... | 438/257 |
| 6,723,617 B1 * | 4/2004 | Choi | .......................... | 438/424 |
| 6,740,900 B2 * | 5/2004 | Hirai | ........................... | 257/40 |
| 6,743,675 B2 * | 6/2004 | Ding | .......................... | 438/257 |
| 6,774,393 B2 * | 8/2004 | Murti et al. | ................... | 257/40 |
| 6,849,870 B2 * | 2/2005 | Koo et al. | ..................... | 257/40 |
| 6,855,949 B2 * | 2/2005 | De Leeuw et al. | ........... | 257/40 |

(Continued)

FOREIGN PATENT DOCUMENTS

WO     WO 03/052841 A1 *   6/2003

OTHER PUBLICATIONS

Silsesquioxane Resins as High-Performance Solution Processible Dielectric Materials for Organic Transistor Applications, Bao et al.*

(Continued)

*Primary Examiner*—Fernando L Toledo
*Assistant Examiner*—Ankush k Singal
(74) *Attorney, Agent, or Firm*—Eugene O. Palazzo; Fay Sharpe LLP

(57) ABSTRACT

A process for fabricating a thin film transistor including: (a) depositing a semiconductor layer; and (b) depositing a multilayer gate dielectric prior to or subsequent to the depositing the semiconductor layer, wherein the multilayer dielectric comprises: (i) a first layer comprising a first material selected from the group consisting of an optionally substituted silsesquioxane, an optionally substituted silsesquioxane-metal oxide hybrid composition, an optionally substituted siloxane-metal oxide hybrid composition, and a mixture thereof, and (ii) a second layer in contact with the first layer, wherein the second layer comprises a second material, wherein the first layer is closer to the semiconductor layer than the second layer.

11 Claims, 2 Drawing Sheets

U.S. PATENT DOCUMENTS

| | | | |
|---|---|---|---|
| 6,891,237 B1* | 5/2005 | Bao et al. | 257/410 |
| 6,893,921 B2* | 5/2005 | Ding | 438/259 |
| 6,905,906 B2* | 6/2005 | Sirringhaus et al. | 438/99 |
| 6,936,190 B2* | 8/2005 | Yoshida | 252/511 |
| 6,974,755 B2* | 12/2005 | Ko et al. | 438/424 |
| 7,091,091 B2* | 8/2006 | Ding | 438/265 |
| 7,122,866 B2* | 10/2006 | Arai et al. | 257/370 |
| 7,259,074 B2* | 8/2007 | Jung et al. | 438/296 |
| 2003/0073291 A1* | 4/2003 | Tseng | 438/296 |
| 2003/0102471 A1 | 6/2003 | Kelley et al. | |
| 2003/0102472 A1 | 6/2003 | Kelley et al. | |
| 2003/0124800 A1* | 7/2003 | Park et al. | 438/257 |
| 2003/0146466 A1* | 8/2003 | Ku | 257/315 |
| 2003/0160230 A1* | 8/2003 | Ong et al. | 257/20 |
| 2003/0160234 A1* | 8/2003 | Ong et al. | 257/40 |
| 2004/0061165 A1* | 4/2004 | Ding | 257/314 |
| 2004/0065937 A1* | 4/2004 | Hsiao | 257/510 |
| 2004/0097080 A1* | 5/2004 | Kim et al. | 438/689 |
| 2004/0201059 A1* | 10/2004 | Ding | 257/315 |
| 2004/0222412 A1 | 11/2004 | Bai et al. | |
| 2004/0263739 A1* | 12/2004 | Sirringhaus et al. | 349/135 |
| 2005/0001210 A1* | 1/2005 | Lee et al. | 257/40 |
| 2005/0009248 A1* | 1/2005 | Weng et al. | 438/149 |
| 2005/0062091 A1* | 3/2005 | Ding | 257/314 |
| 2005/0287741 A1* | 12/2005 | Ding | 438/257 |
| 2006/0113523 A1* | 6/2006 | Kubota et al. | 257/40 |
| 2006/0214154 A1* | 9/2006 | Yang et al. | 257/40 |
| 2007/0026651 A1* | 2/2007 | Leam et al. | 438/552 |
| 2007/0042548 A1* | 2/2007 | Noh et al. | 438/257 |

OTHER PUBLICATIONS

Hybrid organic-inorganic materials by nonhydrolytic Sol-Gel processes: Organosilsesquioxane-metal oxide hybrids, Crouzet et al., Journal of Sol-Gel Science and Technology 26, 335-338, 2003.*

Yiliang Wu et al., U.S. Appl. No. 10/982,472, filed Nov. 5, 2004, titled Dielectric Materials for Electronic Devices.

Yiliang Wu et al., U.S. Appl. No. 11/104,730, filed Apr. 13, 2005, titled TFT Gate Dielectric With Crosslinked Polymer.

F. Garnier et al., "All-Polymer Field-Effect Transistor Realized by Printing Techniques," Science, vol. 265, pp. 1684-1686 (Sep. 16, 1994).

S.Y. Park et al., "Cooperative polymer gate dielectrics in organic thin-film transistors," Appl. Phys. Lett., vol. 85, No. 12, pp. 2283-2285 (Sep. 20, 2004).

F. Garnier et. al., "Molecular Engineering of Organic Semiconductors: Design of Self-Assembly Properties in Conjugated Thiophene Oligomers," J. Am. Chem. Soc., vol. 115, pp. 8716-8721 (1993).

M. Halik et al., "Fully patterned all-organic thin film transistors," Appl. Phys. Lett., vol. 81, No. 2, pp. 289-281 (Jul. 8, 2002).

R. Schroeder et. al., "A study of the threshold voltage in pentacene organic field-effect transistors," Appl. Phys. Lett., vol. 83, No. 15, pp. 3201-3203 (Oct. 13, 2003).

Z. Bao et. al., "Silsesquioxane Resins as High-Performance Solution Processible Dielectric Materials for Organic Transistor Applications," Adv. Funct. Mater., vol. 12, No. 8, pp. 1-6 (Aug. 2002).

J. Veres et al., "Gate Insulators in Organic Field-Effect Transistors," Chem. Mater. 2004, vol. 16, pp. 4543-4555 (published on web Sep. 11, 2004).

Lay-Lay Chua et. al., "High-stability ultrathin spin-on benzocyclobutene gate dielectric for polymer field-effect transistors," Appl. Phys. Lett., vol. 84, No. 17, pp. 3400-3402 (Apr. 26, 2004).

J. Park et. al., "A polymer gate dielectric for high-mobility polymer thin-film transistors and solvent effects," Appl. Phys. Lett., vol. 85, No. 15, pp. 3283-3285 (Oct. 11, 2004).

Z. Turzynski et al., "Influence of diffusion and induced p-bonds on the ultra-violet radiation-initiated crosslinking of polystyrene in solution," Polymer, vol. 31, pp. 1500-1506 (Aug. 1990).

K. Kato, Effect of Molecular Weight on Changes Produced in the Surface Layer of Polystyrene Film in a Nitrogen Atmosphere by Ultraviolet Irradiation, "Journal of Applied Polymer Science," vol. 13, pp. 599-606 (1969).

* cited by examiner

TFT FABRICATION PROCESS

CROSS-REFERENCE TO RELATED APPLICATIONS

This application is a divisional application of co-pending U.S. application Ser. No. 11/104,728 (filing date Apr. 13, 2005) from which priority is claimed, the disclosure of which is totally incorporated herein by reference.

Yiliang Wu et al., U.S. application Ser. No. 10/982,472, filed Nov. 5, 2004, titled DIELECTRIC MATERIALS FOR ELECTRONIC DEVICES, the disclosure of which is totally incorporated herein by reference.

Yiliang Wu et al., U.S. application Ser. No. 11/104,730, filed Apr. 13, 2005, titled TFT GATE DIELECTRIC WITH CROSSLINKED POLYMER, the disclosure of which is totally incorporated herein by reference.

STATEMENT REGARDING FEDERALLY SPONSORED RESEARCH OR DEVELOPMENT

This invention was made with United States Government support under Cooperative Agreement No. 70NANBOH3033 awarded by the National Institute of Standards and Technology (NIST). The United States Government has certain rights in the invention.

BACKGROUND OF THE INVENTION

The present disclosure relates, in various exemplary embodiments, to electronic devices and materials suitable for use in such devices. More specifically, the present disclosure relates to electronic devices that incorporate a multilayer dielectric.

Thin film transistors are fundamental components in modern-age electronics, including, for example, sensor, imaging, and display devices. Thin film transistor circuits using current mainstream silicon technology may be too costly, particularly for large-area device applications such as backplane switching circuits for displays like active matrix liquid crystal monitors or televisions, where high switching speeds are not essential. The high costs of silicon-based thin film transistor circuits are primarily due to the capital-intensive fabrication facilities and the complex high-temperature, high-vacuum photolithographic fabrication processes under strictly controlled environments.

Because of the cost and complexity of fabricating silicon-based thin film transistor circuits using conventional photolithography processes, there has been an increased interest in plastic thin film transistors which can potentially be fabricated using liquid-based patterning and deposition techniques, such as spin coating, solution casting, dip coating, stencil/screen printing, flexography, gravure, offset printing, ink jet-printing, micro-contact printing, and the like, or a combination of these processes. Such processes are generally simpler and more cost effective compared to the complex photolithographic processes used in fabricating silicon-based thin film transistor circuits for electronic devices. To fabricate liquid-processed thin film transistor circuits, liquid processable materials are therefore required.

Most of the current materials research and development activities for plastic thin film transistors has been devoted to semiconductor materials, particularly liquid-processable organic and polymer semiconductors. On the other hand, other material components such as dielectric materials have not been receiving much attention.

In embodiments, it is desirable for the materials for the dielectric to have a number of attributes including for example the following: (1) a good electrical insulating property; and (2) compatibility with the semiconductor materials. An issue with conventional gate dielectrics is that it may be difficult to accommodate all the desired attributes for the dielectric materials. Accommodating the desired attributes (1) and (2) is accomplished by embodiments of the present invention.

The following documents provide background information:

Kelley et al., US Patent Application Publication 2003/0102471 A1.

Kelley et al., US Patent Application Publication 2003/0102472 A1.

Kelley et al., U.S. Pat. No. 6,433,359 B1.

Bai et al., US Patent Application Publication 2004/0222412 A1.

F. Garnier et al., "All-Polymer Field-Effect Transistor Realized by Printing Techniques," *Science,* Vol. 265, pp. 1684-1686 (Sep. 16, 1994).

S. Y. Park et al., "Cooperative polymer gate dielectrics in organic thin-film transistors," *Appl. Phys. Lett.,* Vol. 85, No. 12, pp. 2283-2285 (Sep. 20, 2004).

F. Garnier et. al., "Molecular Engineering of Organic Semiconductors: Design of Self-Assembly Properties in Conjugated Thiophene Oligomers," *J. Am. Chem. Soc.*, Vol. 115, pp. 8716-8721 (1993).

M. Halik et al., "Fully patterned all-organic thin film transistors," *Appl. Phys. Lett.*, Vol. 81, No. 2, pp. 289-291 (Jul. 8, 2002).

R. Schroeder et. al., "A study of the threshold voltage in pentacene organic field-effect transistors," *Appl. Phys. Lett.*, Vol. 83, No. 15, pp. 3201-3203 (Oct. 13, 2003).

Z. Bao et. al., "Silsesquioxane Resins as High-Performance Solution Processible Dielectric Materials for Organic Transistor Applications," *Adv. Funct. Mater.,* Vol. 12, No. 8, pp. 1-6 (August 2002).

J. Veres et al., "Gate Insulators in Organic Field-Effect Transistors," *Chem. Mater.* 2004, Vol. 16, pp. 4543-4555 (published on web Sep. 11, 2004).

Lay-Lay Chua et. al., "High-stability ultrathin spin-on benzocyclobutene gate dielectric for polymer field-effect transistors," *Appl. Phys. Lett.*, Vol. 84, No. 17, pp. 3400-3402 (Apr. 26, 2004).

J. Park et. al., "A polymer gate dielectric for high-mobility polymer thin-film transistors and solvent effects," *Appl. Phys. Lett.*, Vol. 85, No. 15, pp. 3283-3285 (Oct. 11, 2004).

Z. Turzynski et al., "Influence of diffusion and induced π-bonds on the ultra-violet radiation-initiated crosslinking of polystyrene in solution," *Polymer*, Vol. 31, pp. 1500-1506 (August 1990).

K. Kato, "Effect of Molecular Weight on Changes Produced in the Surface Layer of Polystyrene Film in a Nitrogen Atmosphere by Ultraviolet Irradiation, "*Journal of Applied Polymer Science*," Vol. 13, pp. 599-606 (1969).

SUMMARY OF THE DISCLOSURE

There is provided in embodiments an electronic device comprising: a multilayer dielectric comprising: (i) a first layer comprising a first material selected from the group consisting of an optionally substituted silsesquioxane, an optionally substituted silsesquioxane-metal oxide hybrid composition, an optionally substituted siloxane-metal oxide hybrid composition, and a mixture thereof, and (ii) a second layer in contact with the first layer, wherein the second layer comprises a second material.

There is also provided in embodiments a thin film transistor comprising:
(a) a semiconductor layer; and
(b) a multilayer gate dielectric comprising: (i) a first layer comprising a first material selected from the group consisting of an optionally substituted silsesquioxane, an optionally substituted silsesquioxane-metal oxide hybrid composition, an optionally substituted siloxane-metal oxide hybrid composition, and a mixture thereof, and (ii) a second layer in contact with the first layer, wherein the second layer comprises a second material, wherein the first layer is closer to the semiconductor layer than the second layer.

In further embodiments there is provided a thin film transistor comprising:
(a) a semiconductor layer;
(b) a gate electrode;
(c) a source electrode in contact with the semiconductor layer;
(d) a drain electrode in contact with the semiconductor layer; and
(e) a multilayer gate dielectric disposed between the semiconductor layer and the gate electrode, wherein the multilayer dielectric comprises: (i) a first layer comprising a first material selected from the group consisting of an optionally substituted silsesquioxane, an optionally substituted silsesquioxane-metal oxide hybrid composition, an optionally substituted siloxane-metal oxide hybrid composition, and a mixture thereof, and (ii) a second layer in contact with the first layer, wherein the second layer comprises a second material, wherein the first layer is closer to the semiconductor layer than the second layer.

In additional embodiments there is provided a process for fabricating a thin film transistor comprising:
(a) depositing a semiconductor layer; and
(b) depositing a multilayer gate dielectric prior to or subsequent to the depositing the semiconductor layer, wherein the multilayer dielectric comprises: (i) a first layer comprising a first material selected from the group consisting of an optionally substituted silsesquioxane, an optionally substituted silsesquioxane-metal oxide hybrid composition, an optionally substituted siloxane-metal oxide hybrid composition, and a mixture thereof, and (ii) a second layer in contact with the first layer, wherein the second layer comprises a second material, wherein the first layer is closer to the semiconductor layer than the second layer.

BRIEF DESCRIPTION OF THE DRAWINGS

Other aspects of the present invention will become apparent as the following description proceeds and upon reference to the following figures which represent exemplary embodiments.

Unless otherwise noted, the same reference numeral in different Figures refers to the same or similar feature.

DETAILED DESCRIPTION

Figure 1:
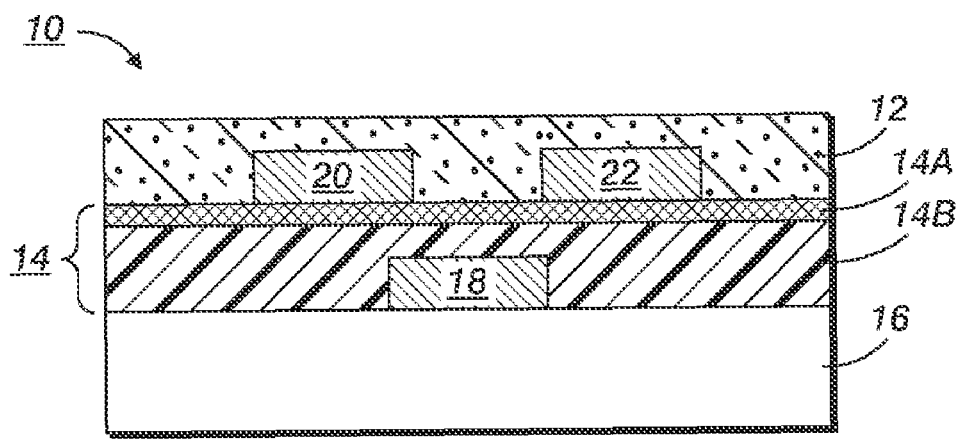
FIG. 1 represents a first embodiment of the present invention in the form of a TFT.

Aspects of the present disclosure relate to an electronic device, specifically a thin film transistor, comprising a multilayer dielectric. In the context of a thin film transistor, the multilayer dielectric also can be referred to as a "multilayer gate dielectric." Besides a thin film transistor, the multilayer dielectric can be used in other types of electronic devices including for example an embedded capacitor and an electroluminescent lamp.

The first layer of the multilayer dielectric comprises a first material selected from the group consisting of an optionally substituted silsesquioxane, an optionally substituted silsesquioxane-metal oxide hybrid composition, an optionally substituted siloxane-metal oxide hybrid composition, and a mixture thereof. In embodiments, the optionally substituted silsesquioxane and the optionally substituted silsesquioxane component (of the optionally substituted silsesquioxane-metal oxide hybrid composition) are represented by the exemplary formula $(SiR)_{2n}O_{3n}$. In embodiments, the optionally substituted siloxane component (of the optionally substituted siloxane-metal oxide hybrid composition) is represented by the exemplary formula $(R_2SiO)_n$. For each of the general formulas for the optionally substituted silsesquioxane, the optionally substituted silsesquioxane component, and the optionally substituted siloxane component, "n" represents the number of repeating units ranging for example from about 4 to about 20,000. Generally, the R substitutent for each of the optionally substituted silsesquioxane, the optionally substituted silsesquioxane component, and the optionally substituted siloxane component may be independently selected from the exemplary group consisting of hydrogen, alkyl including $C_1$-$C_{20}$ aliphatic and $C_4$-$C_{20}$ alicyclic, arylalkyl, alkenyl, alkoxyl, aryl, or aryloxy, and combinations thereof. Organosilsesquioxane and organosiloxane respectively refer to optionally substituted silsesquioxane/optionally substituted silsesquioxane component, and optionally substituted siloxane component wherein R substituents are other than hydrogen. Examples of a suitable optionally substituted siloxane component include, but are not limited to hexamethyldisiloxane and octamethyltrisiloxane. Examples of suitable optionally substituted silsesquioxanes/optionally substituted silsesquioxane components include for example hydrogen silsesquioxane (HSQ), methylsilsesquionxane (MSQ), hydrido-organo silsesquioxane (HOSQ), and the like, and combinations thereof. In embodiments, the R substitutent is hydrogen and thus the silsesquioxane/silsesquioxane component and siloxane component are unsubstituted.

Metal oxide components of optionally substituted silsesquioxane-metal oxide hybrid composition and optionally substituted siloxane-metal oxide hybrid composition are, in embodiments, oxide of titanium, aluminum, zirconium, hafnium, tantalum, strontium, yttrium, lanthanum and mixtures thereof. In embodiments, the oxygen containing portion of metal oxide may comprise oxygen alone. Examples of suitable metal oxides include, but are not limited to, $TiO_2$, $ZrO_2$, $Al_2O_3$, $La_2O_3$, $Y_2O_3$, $Ta_2O_5$, $HfO_2$, and the like. In other embodiments, the oxygen containing portion may be methoxy, ethoxy, propoxy, isopropoxy, butoxy, pentoxy, phenoxy, and the like, and combinations thereof. In some embodiments, the metal oxide component is generated by hydrolyzing the corresponding metal oxide precursors. For example, $TiO_2$ component could be incorporated in the optionally substituted silsesquioxane-metal oxide hybrid composition via in-situ hydrolysis of the corresponding precursor of titaniumisopropoxide.

Optionally substituted silsesquioxane, optionally substituted silsesquioxane-metal oxide hybrid composition, and optionally substituted siloxane-metal oxide hybrid composition may be prepared by any suitable methods known in the art. Generally, optionally substituted silsesquioxane and the hybrid compositions (referring to optionally substituted silsesquioxane-metal oxide hybrid composition and to optionally substituted siloxane-metal oxide hybrid composition) are prepared in solution, and are utilized as a "prepolymer" for the fabrication of dielectric layers for use in electronic devices such as thin film transistors. In embodiments, the optionally substituted silsesquioxane and the hybrid compositions have good solubility in common solvents such as ketones, esters, alcohols, ether, and the like. In embodiments, the optionally substituted silsesquioxane and the hybrid compositions are prepared based on sol-gel chemistry. Specifically, the optionally substituted silsesquioxane is prepared by reacting small molecular silsesquioxane for example methyl silsesquioxane in an acidic solution. The hybrid compositions are, in embodiments, prepared by first reacting the siloxy component in an acidic solution, followed by reaction with the metal oxide component. The optionally substituted silsesquioxane and the hybrid compositions, in embodiments, are not isolated from the solvent, but are used as a solution for fabricating a dielectric layer.

The optionally substituted silsesquioxane component and the optionally substituted siloxane component are present in the optionally substituted silsesquioxane-metal oxide hybrid composition and the optionally substituted siloxane-metal oxide hybrid composition in an amount of from about 5 to about 95 percent by weight, and the metal oxide component is present in an amount of from about 5 to about 95 percent by weight such that the combined amount of optionally substituted silsesquioxane component with metal oxide component or of the optionally substituted siloxane component with metal oxide components equals 100 percent by weight of the respective optionally substituted silsesquioxane-metal oxide hybrid composition or the optionally substituted siloxane-metal oxide hybrid composition, excluding the amounts of solvents that may be present in the hybrid composition. In embodiments, the ratio of the optionally substituted silsesquioxane component or the optionally substituted siloxane component to the metal oxide component in the hybrid composition is from about 19:1 to about 1:19.

An exemplary structure of the optionally substituted silsesquioxane-metal oxide hybrid composition is:

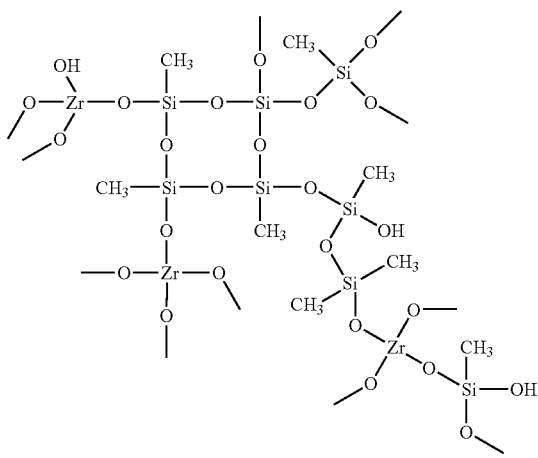

wherein the metal oxide is zirconium oxide.

An exemplary structure of optionally substituted siloxane-metal oxide hybrid composition is:

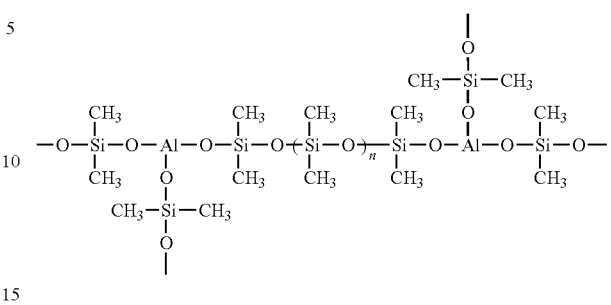

wherein the metal oxide is aluminum oxide, and n is an integer number.

The second layer comprises a second material, in embodiments, an electrically insulating material. Useful materials for the second layer may comprise for example an organic or inorganic electrically insulating material, or combinations thereof. In embodiments, the organic electrically insulating material may comprise for example polymeric materials such as polyimides, epoxies, polyarcrylates, polyvinyls, polyesters, polyethers, the copolymers of the above polymers, and the mixture thereof. In embodiments of the second material, the polymeric materials are non-crosslinked polymers. In other embodiments of the second material, the polymeric materials are crosslinked polymers. Crosslinking of the polymeric materials may be realized by any suitable methods. For example, crosslinking of the polymeric materials can be realized by thermal or photochemical crosslinking with the addition of a crosslinking agent of for example compounds containing at least two isocyanate groups, compounds containing at least two epoxy groups, compounds containing at least two carboxylic acid groups, and acid anhydrides of carboxylic acid, and a mixture thereof. In embodiments of the second material, crosslinking of the polymeric materials is achieved by irradiation with a UV light without the addition of crosslinking agents. Specifically, the polymeric materials may be for example a non-crosslinked or a radiation-crosslinked polymer comprising polymerized one or more monomers, wherein the one or more monomers include an optionally substituted vinyl arylalcohol. More specifically the polymeric material is an optionally crosslinked copolymer of an optionally substituted vinyl arylalcohol and an acrylate. In other embodiments of the second material, the polymeric material is an optionally crosslinked copolymer of a vinylphenol and a methyl methacrylate. More specifically, the polymeric material is an optionally crosslinked poly(vinyl arylalcohol).

In embodiments of the second material, the inorganic electrically insulating material may comprise for example silicon oxide, aluminum oxide, tantalum oxide, titanium oxide, yttrium oxide, hafnium oxide, zirconium oxide, lanthanum oxide, strontiates, tantalates, titanates, zirconates, silicon nitride, zinc selenide, zinc sulfide, and a mixture thereof.

The multilayer dielectric which comprises a first layer and a second layer may have any thicknesses suitable for use in electronic devices such as thin film transistors. In embodiments, the multilayer dielectric has a thickness of from about 50 nanometers to about 2 micrometers. In other embodiments, the multilayer dielectric has a thickness of from about 200 nanometers to about 1 micrometer. The first layer of the multilayer dielectric has a thickness for example less than about 2 micrometers, more preferably less than about 500 nanometers, more preferably less than about 100 nanometers.

The second layer of the multilayer dielectric has a thickness for example at least about 5 Å, more preferably at least about 100 Å, more preferably at least about 100 nanometers.

The performance of the first layer in a number of areas including for example the extent of electric insulation and the extent of compatibility of the multilayer dielectric with the semiconductor layer may vary in embodiments with the performance in each area independently ranging for instance from "excellent" to "minimal" (a midlevel performance can be described for example as "satisfactory"). In embodiments, the first layer provides both excellent electric insulation and excellent compatibility of the semiconductor layer with the multilayered dielectric. In other embodiments, the first layer provides satisfactory electric insulation and satisfactory compatibility of the semiconductor layer with the multilayered dielectric. In still other embodiments, the first layer provides minimal electric insulation and satisfactory compatibility of the semiconductor layer with the multilayered dielectric.

In embodiments, the first layer may be referred to as an "interfacial layer" particularly when the first layer is thin. The "interfacial layer" is considered the first layer of the multilayer dielectric even if the "interfacial layer" provides minimal electrical insulation.

In embodiments, the term "compatible" (or "compatibility") refers to how well the semiconductor layer can perform electrically when it is deposited on the surface of the first layer. For example, a hydrophobic surface is generally preferred for polythiophene semiconductors. In embodiments, the first layer has a hydrophobic surface and therefore may exhibit satisfactory to excellent compatibility with polythiophene semiconductors.

Any suitable methods can be used to deposit the multilayer dielectric. Exemplary methods used to deposit the second layer are for example sputtering, vacuum evaporation, Plasma Enhanced Chemical Vapor Deposition ("PECVD"), atomic layer deposition, spin coating, solution casting, dip coating, stencil/screen printing, flexography, gravure, offset printing, ink jet-printing, micro-contact printing, and the like, or a combination of these processes. Exemplary methods used to deposit the first layer are for example spin coating, solution casting, dip coating, stencil/screen printing, flexography, gravure, offset printing, ink jet-printing, micro-contact printing, and the like, or a combination of these processes.

In embodiments, the second layer is a liquid deposited layer. Liquid deposition refers to processes wherein a liquid is used as a vehicle to carry the materials. In embodiments, the liquid may be for example a solvent such as water or an organic solvent. In other embodiments, the liquid may be the materials in their molten state. Examples of liquid deposition techniques are for instance spin coating, blade coating, rod coating, screen printing, ink jet printing, stamping and the like. In embodiments, both the first and the second layers are liquid deposited layers.

In embodiments, the first layer is deposited prior or subsequent to the second layer. In embodiments, both the first layer and the second layer are deposited prior or subsequent to the semiconductor layer wherein there is a semiconductor layer in the electronic device, and the first layer is closer to the semiconductor layer than the second layer. An exemplary process for the multilayer dielectric and a semiconductor layer is given in the following:

i) deposit the second layer comprising the second material on a substrate;
ii) optionally dry and crosslink the second layer;
iii) deposit the first layer comprising the first material on top of the second layer;
iv) optionally dry and crosslink the first layer; and
v) deposit a semiconductor layer on top of the first layer.

In FIG. 1, there is schematically illustrated an organic thin film transistor ("OTFT") configuration 10 comprised of a substrate 16, in contact therewith a metal contact 18 (gate electrode) and a multilayer gate dielectric 14 (first layer 14A, second layer 14B) on top of which two metal contacts, source electrode 20 and drain electrode 22, are deposited. Over and between the metal contacts 20 and 22 is an organic semiconductor layer 12 as illustrated herein.

Figure 2:
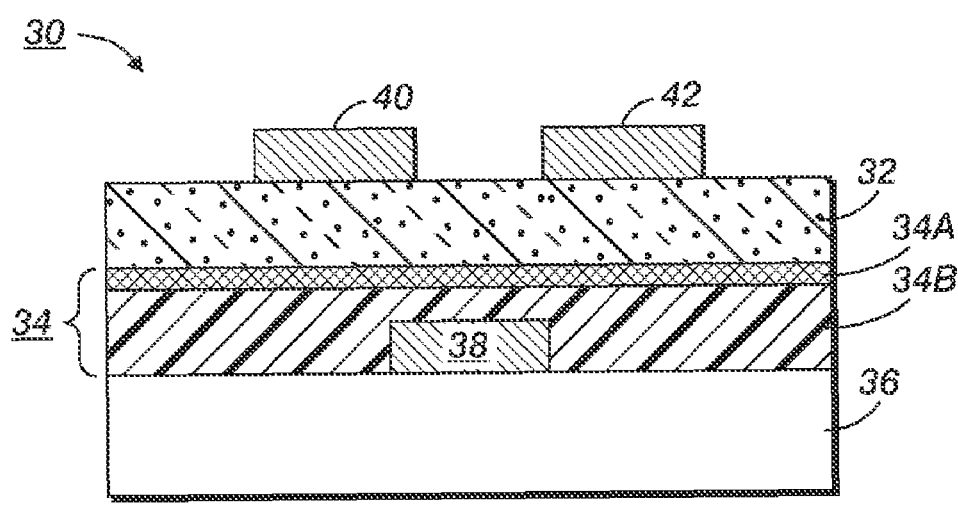
FIG. 2 represents a second embodiment of the present invention in the form of a TFT.

FIG. 2 schematically illustrates another OTFT configuration 30 comprised of a substrate 36, a gate electrode 38, a source electrode 40 and a drain electrode 42, a multilayer gate dielectric 34 (first layer 34A, second layer 34B), and an organic semiconductor layer 32.

Figure 3:
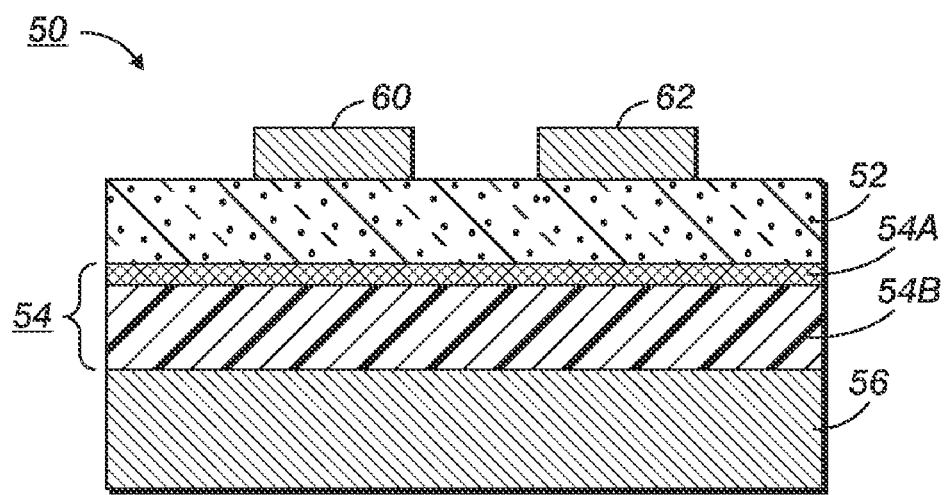
FIG. 3 represents a third embodiment of the present invention in the form of a TFT.

FIG. 3 schematically illustrates a further OTFT configuration 50 comprised of a heavily n-doped silicon wafer 56 which acts as both a substrate and a gate electrode, a multilayer gate dielectric 54 (first layer 54A, second layer 54B), and an organic semiconductor layer 52, on top of which are deposited a source electrode 60 and a drain electrode 62.

Figure 4:
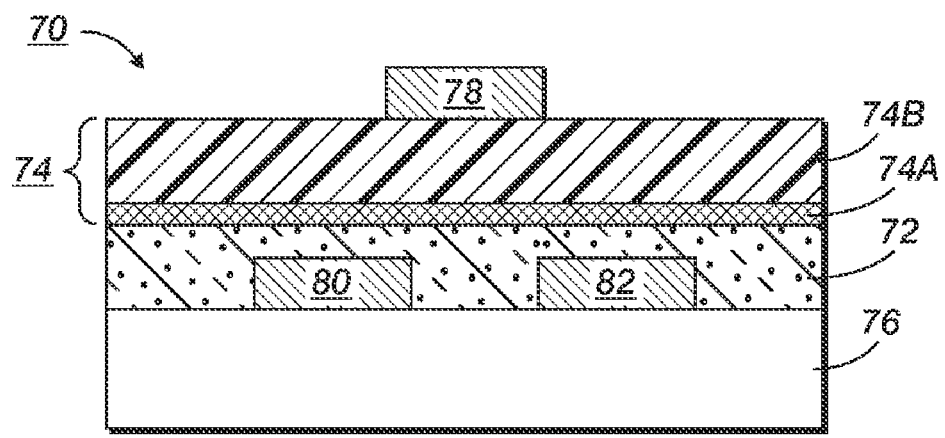
FIG. 4 represents a fourth embodiment of the present invention in the form of a TFT.

FIG. 4 schematically illustrates an additional OTFT configuration 70 comprised of substrate 76, a gate electrode 78, a source electrode 80, a drain electrode 82, an organic semiconductor layer 72, and a multilayer gate dielectric 74 (first layer 74A, second layer 74B).

Substrate

The substrate may be composed of for instance silicon, glass plate, plastic film or sheet. For structurally flexible devices, a plastic substrate, such as for example polyester, polycarbonate, polyimide sheets and the like may be preferred. The thickness of the substrate may be from about 10 micrometers to over about 10 millimeters with an exemplary thickness being from about 50 to about 100 micrometers, especially for a flexible plastic substrate and from about 1 to about 10 millimeters for a rigid substrate such as glass plate or silicon wafer.

Electrodes

The gate electrode can be a thin metal film, a conducting polymer film, a conducting film made from conducting ink or paste, or the substrate itself can be the gate electrode, for example heavily doped silicon. Examples of gate electrode materials include but are not restricted to aluminum, gold, chromium, indium tin oxide, conducting polymers such as polystyrene sulfonate-doped poly(3,4-ethylenedioxythiophene) (PSS-PEDOT), conducting ink/paste comprised of carbon black/graphite or colloidal silver dispersion in polymer binders, such as ELECTRODAG™ available from Acheson Colloids Company. The gate electrode layer can be prepared by vacuum evaporation, sputtering of metals or conductive metal oxides, coating from conducting polymer solutions or conducting inks by spin coating, casting or printing. The thickness of the gate electrode layer ranges for example from about 10 to about 200 nanometers for metal films and in the range of about 1 to about 10 micrometers for polymer conductors.

The source and drain electrode layers can be fabricated from materials which provide a low resistance ohmic contact to the semiconductor layer. Typical materials suitable for use as source and drain electrodes include those of the gate electrode materials such as gold, nickel, aluminum, platinum, conducting polymers and conducting inks. Typical thicknesses of source and drain electrodes are about, for example, from about 40 nanometers to about 10 micrometers with the more specific thickness being about 100 to about 400 nanometers.

Semiconductor Layer

Materials suitable for use as the organic semiconductor layer include acenes, such as anthracene, tetracene, pentacene, and substituted pentacenes, perylenes, fullerenes, phthalocyanines, oligothiophenes, polythiophenes, and substituted derivatives thereof. In embodiments, the organic semiconductor layer is formed from a liquid processable material. Examples of suitable semiconductor materials include polythiophenes, oligothiophenes, and the semiconductor polymers described in U.S. application Ser. No. 10/042,342, which is published as U.S. Patent Application No. 2003/0160234, and U.S. Pat. Nos. 6,621,099, 6,774,393, and 6,770,904, the disclosures of which are incorporated herein by reference in their entireties. Additionally, suitable materials include the semiconductor polymers disclosed in "Organic Thin Film Transistors for Large Area Electronics" by C. D. Dimitrakopoulos and P. R. L. Malenfant, Adv. Mater., Vol. 12, No. 2, pp. 99-117 (2002), the disclosure of which is also incorporated herein by reference.

The semiconductor layer may be formed by any suitable means including but not limited to vacuum evaporation, spin coating, solution casting, dip coating, stencil/screen printing, flexography, gravure, offset printing, inkjet-printing, microcontact printing, a combination of these processes, and the like. In embodiments, the semiconductor layer is formed by a liquid deposition method. In embodiments, the semiconductor layer has a thickness of from about 10 nanometers to about 1 micrometer. In further embodiments, the organic semiconductor layer has a thickness of from about 30 to about 150 nanometers. In other embodiments, the semiconductor layer has a thickness of from about 40 to about 100 nanometers.

Gate Dielectric

The composition and formation of the multilayer gate dielectric are described herein. In embodiments, the first layer and the second layer of the multilayer gate dielectric contact each other. In embodiments, the first layer of the multilayer gate dielectric contacts the semiconductor layer.

The multilayer gate dielectric, the gate electrode, the semiconductor layer, the source electrode, and the drain electrode are formed in any sequence. In embodiments, the gate electrode and the semiconductor layer are both in contact with the multilayer gate dielectric, and the source electrode and the drain electrode are both in contact with the semiconductor layer. The phrase "in any sequence" includes sequential and simultaneous formation. For example, the source electrode and the drain electrode can be formed simultaneously or sequentially. The composition, fabrication, and operation of field effect transistors are described in Bao et al., U.S. Pat. No. 6,107,117, the disclosure of which is totally incorporated herein by reference.

The invention will now be described in detail with respect to specific exemplary embodiments thereof, it being understood that these examples are intended to be illustrative only and the invention is not intended to be limited to the materials, conditions, or process parameters recited herein. All percentages and parts are by weight unless otherwise indicated. As used herein, room temperature refers to a temperature ranging for example from about 20 to about 25 degrees C.

Example 1

In this example, poly(vinyl phenol) (Aldrich, Mw=20,000) was used as an electrically insulating material for the second layer, and poly(methyl silsesquioxane) was used as the material for the first layer. A polythiophene having the following formula was used as the semiconductor:

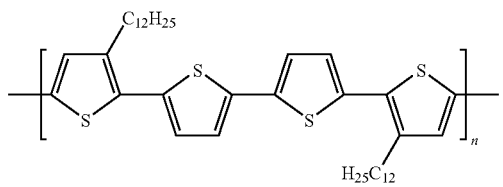

where n is a number of from about 5 to about 5,000. This polythiophene and its preparation are described in Beng Ong et al., US Patent Application Publication No. US 2003/0160230 A1, the disclosure of which is totally incorporated herein by reference.

Poly(methyl silsesquioxane) was prepared using methyltrimethoxysilane as precursor according to the following procedure. A mixture of 0.88 grams of aq. 0.1 wt % hydrochloric acid solution and 5.13 grams of tetrahydrofuran was added dropwise to a mixture of 4.08 grams of methyltrimethoxysilane and 9.24 grams of methylisobutylketone in a 3-necked flask cooled with an ice bath over a period of 30 minutes with rigorous stirring under a dry atmosphere. The resulting mixture was allowed to warm to room temperature and held there for 5 minutes before being heated to 60° C. and held there for 24 hours.

Bottom-gate, top-contact TFTs were used to illustrate the invention. A 7 wt % of poly(vinyl phenol) in n-butanol solution was filtered through a 0.2-micron syringe filter, and then deposited on an n-doped silicon wafer by spin coating. The resultant 420-nm thin film was dried at 60° C. for half hour, then annealed at 140° C. for 10 min. After cooling down to room temperature, the film was irradiated with UV light for 20 min. The irradiated film was subsequently immersed in n-butanol at 60° C. to remove the unreacted polymer to give a 380-nm crosslinked film after drying. The crosslinked film was very resistant towards solvent attacks by common organic solvents such as toluene, THF, chlorobenzene, and dichlorobenzene. A thin layer of poly(methyl silsesquioxane) (~50 nm) was then spin-coated on top of the poly(vinylphenol) layer and then cured by heating at 140-160 degree C. for 1-4 hours. To measure the capacitance, a gold electrode layer was vacuum evaporated on top of the dielectric layer. Using a capacitor meter, the capacitance was measured to be 9.0 nF/cm$^2$. The dielectric constant of the dielectric layer was calculated to be 4.0.

The polythiophene semiconductor layer was deposited on top of the dielectric layer by spin coating. The semiconductor layer was dried in a vacuum oven at about 80° C. to about 145° C. for 30 minutes, and then cooled down to room temperature. Subsequently, a set of source/drain electrode pairs were vacuum evaporated on top of the resulting semiconductor layer through a shadow mask to form a series of thin film transistors of various dimensions.

The resulting transistors were evaluated using a Keithley 4200 Semiconductor characterization system. Thin film transistors with channel lengths of about 60 micron and channel widths of about 1000 microns were characterized by measuring their output and transfer curves. The devices turned on at around 0 volts and provided field-effect mobility of 0.11 cm$^2$/V·s and a current on/off ratio of about $8.0 \times 10^4$.

Comparative Example 1

In this comparative example, the devices were fabricated using the same procedure as in Example 1 except that no first layer was used. Thin film transistors with channel lengths of about 60 micron and channel widths of about 1000 microns were used for evaluation. The devices turned on at around 0 volts and gave field-effect mobility of 0.003 cm$^2$/V·s and a current on/off ratio of about $2.0 \times 10^4$. The mobility is significantly lower than those of the devices having multilayer dielectric as shown in Example 1.

Example 2

In this example, poly(methyl silsesquioxane) was used for the first layer while poly(4-vinylphenol-co-methyl methacrylate) was used for the second layer. Bottom-gate, top-contact OTFTs were fabricated using the same procedure as in Example 1. Thin film transistors with channel lengths of about 60 microns and channel widths of about 1000 microns were used for evaluation. The devices showed field-effect mobility of 0.12 cm$^2$/V·s and a current on/off ratio of 1.5×10$^5$.

Example 3

The preparation of methyl silsesquioxane/zirconium oxide hybrid composition is shown in Scheme 1. A mixture of 0.88 grams of aq. 0.1 wt % hydrochloric acid and 5.13 grams of tetrahydrofuran was added dropwise to a mixture of 4.08 grams of methyltrimethoxysilane and 10 grams of methyl-isobutylketone in a 3-necked flask cooled with an ice bath with vigorous stirring under a dry atmosphere. The mixture was allowed to warm to room temperature and then heated to 60° C. for 3 hours. Subsequently, a mixture of 80 wt % 6.166 grams of zirconium butoxide and 12.8 grams of tetrahydrofuran was added dropwise over a period of 30 minutes. After addition of 18.0 grams of tetrahydrofuran, the mixture was stirred at 60° C. for 3 hours and then cooled to room temperature before being used in fabricating the dielectric layer.

Scheme 1:
Preparation of polysiloxane and polysiloxane-zirconium hybrid composition

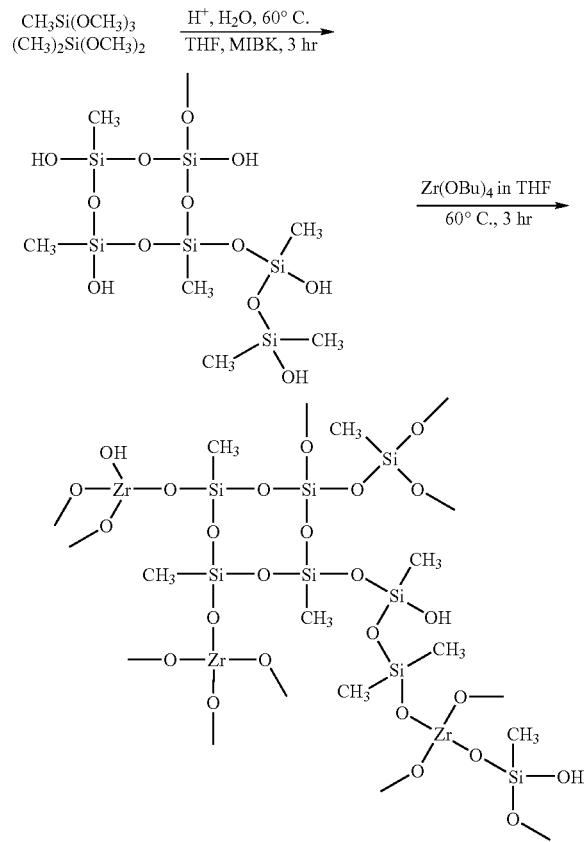

Bottom-gate, top-contact OTFTs were fabricated using the same procedure as in Example 1. Poly(vinyl phenol) was used for the second layer, and the methyl silsesquioxane/zirconium oxide hybrid composition was used for the first layer. Thin film transistors with channel lengths of about 60 microns and channel widths of about 1000 microns were used for evaluation. The devices showed field-effect mobility of 0.09 cm$^2$/V·s and a current on/off ratio of over 6.4×10$^4$.

Example 4

Polyester sheet with aluminum coating was used a substrate in this example with the aluminum layer functioning as the gate electrode. Poly(4-vinylphenol-co-methyl methacrylate) of Example 2 was used for the second layer, while poly(methyl silsesquioxane) of Example 1 was used for the first layer. Bottom-gate, top-contact OTFTs were fabricated using the same procedure as in Example 1. Thin film transistors with channel lengths of about 60 microns and channel widths of about 1000 microns were used for evaluation. The devices showed field-effect mobility of 0.15 cm$^2$/V·s and a current on/off ratio of over 2×10$^5$.

Example 5

In this example, n-doped silicon wafer with a thermally grown silicon oxide (100 nm) was used. The wafer functioned as the gate electrode and the substrate while the silicon oxide layer acted as the second layer for the multilayer dielectric. The wafer was first rinsed with isoproponal, then cleaned with argon plasma, followed by rinsing with isopropanol. Poly(methyl silsesquioxane) as prepared in Example 1 was diluted with n-butanol to a suitable concentration, filtered through a 0.2-micron filter, and then spin coated on top of the silicon oxide layer at 3000 rpm for 60 s. The resulting thin film was cured at 140-200 degree C. for 30 min to result in the first layer composed of the poly(methyl silsesquioxane). The semiconductor and the source-drain electrodes were then deposited using the procedures of Example 1. Thin film transistors with channel lengths of about 60 microns and channel widths of about 1000 microns were used for evaluation. The devices showed field-effect mobility of 0.1 cm$^2$/V·s and a current on/off ratio of over 6×10$^5$.

Comparative Example 2

In this comparative example, the devices were fabricated using the same procedure as in Example 5 except that no first layer was used. Thin film transistors with channel lengths of about 60 microns and channel widths of about 1000 microns were used for evaluation. The devices showed field-effect mobility of 0.0004 cm$^2$/V·s and a current on/off ratio of over 2×10$^3$. Both the mobility and current on/off ratio are significantly lower than those of the devices in Example 5. This confirms that in embodiments the multilayer dielectric of the present electronic device is a superior dielectric design for plastic thin film transistors.

The invention claimed is:

1. A process for fabricating a thin film transistor comprising:
   (a) depositing a semiconductor layer; and
   (b) depositing a multilayer gate dielectric prior to or subsequent to the depositing the semiconductor layer, wherein the multilayer dielectric comprises: (i) a first layer comprising a first material selected from the group consisting of an organosilsesquioxane-metal oxide hybrid composition, an organosiloxane-metal oxide hybrid composition, and a mixture thereof, and (ii) a second layer in contact with the first layer, wherein the second layer comprises a second material, wherein the first layer is closer to the semiconductor layer than the second layer wherein the first layer contacts the semiconductor layer wherein the first layer is subjected to a curing temperature ranging from about 140 to about 200 degrees C.

2. The process of claim 1, wherein the depositing the semiconductor layer is accomplished by liquid deposition.

3. The process of claim 1, wherein the depositing the multilayer gate dielectric is accomplished by liquid deposition.

4. The process of claim 1, wherein the depositing the semiconductor layer and the depositing the multilayer gate dielectric are both accomplished by liquid deposition.

5. The process of claim 1, wherein the second layer comprises an inorganic compound selected from the group consisting of silicon oxide, aluminum oxide, tantalum oxide, titanium oxide, yttrium oxide, hafnium oxide, zirconium oxide, lanthanum oxide, strontiates, tantalates, titanates, zirconates, silicon nitride, zinc selenide, zinc sulfide, and a mixture thereof.

6. The process of claim 1, wherein the second material is a non-crosslinked polymer comprising polymerized one or more monomers, wherein the one or more monomers includes an optionally substituted vinyl arylalcohol.

7. The process of claim 1, wherein the second material is a radiation-induced crosslinked polymer comprising polymerized one or more monomers, wherein the one or more monomers includes an optionally substituted vinyl arylalcohol.

8. The process of claim 1, wherein the second material is an optionally crosslinked copolymer of an optionally substituted vinyl arylalcohol and an acrylate.

9. The process of claim 1, wherein the second material is an optionally crosslinked copolymer of a vinylphenol and a methyl methacrylate.

10. The process of claim 1, wherein the second material is an optionally crosslinked poly(vinyl arylalcohol).

11. The process of claim 1, further comprising employing a plastic substrate.

* * * * *

UNITED STATES PATENT AND TRADEMARK OFFICE
CERTIFICATE OF CORRECTION

PATENT NO. : 7,553,706 B2  Page 1 of 1
APPLICATION NO. : 11/276634
DATED : June 30, 2009
INVENTOR(S) : Liu et al.

It is certified that error appears in the above-identified patent and that said Letters Patent is hereby corrected as shown below:

Title Page, item (74) Attorney, Agent, or Firm should appear as follows:

Fay Sharpe LLP

Signed and Sealed this

Thirty-first Day of August, 2010

David J. Kappos
*Director of the United States Patent and Trademark Office*

UNITED STATES PATENT AND TRADEMARK OFFICE
CERTIFICATE OF CORRECTION

PATENT NO. : 7,553,706 B2
APPLICATION NO. : 11/276634
DATED : June 30, 2009
INVENTOR(S) : Ping Liu et al.

Page 1 of 1

It is certified that error appears in the above-identified patent and that said Letters Patent is hereby corrected as shown below:

In the Specification:

Column 1, line 22, after "Cooperative Agreement No.", please delete "70NANBOH3033" and insert --70NANB0H3033--.

Signed and Sealed this
Tenth Day of September, 2013

Teresa Stanek Rea
*Acting Director of the United States Patent and Trademark Office*